United States Patent [19]

Shimura et al.

[11] Patent Number: 5,414,273
[45] Date of Patent: May 9, 1995

[54] HETEROJUNCTION BIPOLAR TRANSISTOR

[75] Inventors: Teruyuki Shimura; Naohito Yoshida, both of Itami, Japan

[73] Assignee: Mitsubishi Denki Kabushiki Kaisha, Tokyo, Japan

[21] Appl. No.: 202,583

[22] Filed: Feb. 28, 1994

[30] Foreign Application Priority Data

Mar. 5, 1993 [JP] Japan .................. 5-044867

[51] Int. Cl.6 ............. H01L 27/12; H01L 45/00; H01L 29/161; H01L 29/205
[52] U.S. Cl. ........................... 257/17; 257/23; 257/197
[58] Field of Search .............. 257/17, 12, 13, 16, 257/23, 22, 25, 14, 197

[56] References Cited

U.S. PATENT DOCUMENTS 5,091,756 2/1992 Iga et al. .................. 257/13

FOREIGN PATENT DOCUMENTS

| 1-77166 | 3/1989 | Japan | 257/23 |
| 215636 | 1/1990 | Japan | 257/195 |
| 2140940 | 5/1990 | Japan | 257/195 |
| 3-284876 | 12/1991 | Japan | 257/25 |
| 4-251934 | 9/1992 | Japan | 257/16 |

OTHER PUBLICATIONS

Uenohara et al, "Analysis of Electron Wave Reflectivity and Leakage Current of Multi Quantum Barrier MOB", Transactions of Institutue of Electronics and Communication Engineers of Japan, vol. J70-C, No. 6, Jun., 1987, pp. 851-857.
Ishibashi et al, "A Possible Near-Ballistic Collection In An AlGaAs/GaAs HBT With A Modified Collector Structure", IEEE Transactions on Electron Devices, vol. 35, No. 4, Apr. 1988, pp. 401-404.

Primary Examiner—Jerome Jackson
Assistant Examiner—Donald L. Monin, Jr.
Attorney, Agent, or Firm—Leydig, Voit & Mayer

[57] ABSTRACT

A heterojunction bipolar transistor includes a multiquantum barrier structure as part of the collector and contacting the base. The MQB has an energy band structure in which the height of the effective potential barrier of the MQB increases in steps from the base into the collector. Therefore, an electric field in the collector in the vicinity of the base-collector interface is relaxed and intervalley scattering of electrons is suppressed whereby a reduction in electron mobility due to the intervalley scattering is suppressed, reducing transit time of electrons in the collector.

10 Claims, 5 Drawing Sheets

HETEROJUNCTION BIPOLAR TRANSISTOR

FIELD OF THE INVENTION

The present invention relates to heterojunction bipolar transistors (hereinafter referred to as HBTs) and, more particularly, to collector structures of HBTs.

BACKGROUND OF THE INVENTION

FIG. 6 is a sectional view illustrating a conventional n-p-n type GaAs HBT. In the figure, reference numeral 51 designates a semi-insulating GaAs substrate. An n+ type GaAs collector contact layer 52 is disposed on the GaAs substrate 51. An n type GaAs collector layer 53 is disposed on a part of the collector contact layer 52. A p+ type GaAs base layer 54 is disposed on the collector layer 53. An n type $Al_{0.3}Ga_{0.7}As$ emitter layer 55 is disposed on a part of the base layer 54. An emitter electrode 58 is disposed on the emitter layer 55. Base electrodes 57 are disposed on the base layer 54 at opposite sides of the emitter layer 55. Collector electrodes 56 are disposed on the collector contact layer 52 at opposite sides of the collector layer 53. Reference numeral 59 designates insulating regions formed by ion implantation.

FIG. 7 is an energy band diagram of the HBT of FIG. 6 during operation. In the figure, the same reference numerals as in FIG. 6 designate the same parts.

A description is given of the operation. In FIG. 7, a bias voltage $V_{BE}$ is applied between the emitter layer 55 and the base layer 54, and a bias voltage $V_{CB}$ is applied between the base layer 54 and the collector layer 53. Electrons flow from the emitter layer 55 through the base layer 54 to the collector layer 53. Holes flow from the base layer 54 to the emitter layer 55. In this HBT, the bias voltage $V_{BE}$ controls the flow of electrons and holes.

In this conventional n-p-n GaAs HBT, since the collector layer 53 usually comprises n type GaAs, when the bias voltage $V_{CB}$ is applied between the base layer 54 and the collector layer 53 during operation, a strong electric field is applied to the interface between the base layer and the collector layer. The electric field causes intervalley scattering of electrons, whereby the electron mobility is reduced and the collector transit time is increased. As a result, the operating speed of the HBT is reduced.

SUMMARY OF THE INVENTION

It is an object of the present invention to provide a high-speed HBT with reduced collector transit time of electrons.

Other objects and advantages of the present invention will become apparent from the detailed description given hereinafter; it should be understood, however, that the detailed description and specific embodiment are given by way of illustration only since various changes and modifications within the spirit and scope of the invention will become apparent to those skilled in the art from this detailed description.

According to a first aspect of the present invention, an HBT includes a multiquantum barrier (hereinafter referred to as MQB) structure in the collector contacting the base. The MQB structure has an energy band structure in which the height of the effective potential barrier increases in steps from the base into the collector. Therefore, the electric field in a region of the collector in the vicinity of the base-collector interface is relaxed, whereby a reduction in the electron mobility due to the intervalley scattering of electrons is suppressed, reducing the collector transit time.

According to a second aspect of the present invention, in an HBT, an MQB structure in the collector and contacting the base comprises a plurality of semiconductor layers, and the thicknesses of these semiconductor layers are gradually reduced from the base into the collector, whereby the height of the effective potential barrier of the MQB increases in steps from the base into the collector. Therefore, an HBT that relaxes the electric field in a region of the collector in the vicinity of the base-collector interface to reduce the collector transit time and that is fabricated in a relatively simple process can be achieved.

According to a third aspect of the present invention, in an HBT, an MQB structure in the collector and contacting the base comprises a plurality of semiconductor layers, and the energy band gaps of these semiconductor layers are gradually increased from the base to the collector, whereby the height of the effective potential barrier of the MQB is increased in steps from the base into the collector. Therefore, the electric field in a region of the collector in the vicinity of the base-collector interface is relaxed, whereby a reduction in the electron mobility due to intervalley scattering of electrons is suppressed, reducing the collector transit time. In addition, since the energy band gap of the semiconductor layer in contact with the base is reduced, the electron injection efficiency from the base to the collector is increased.

According to a fourth aspect of the present invention, in an HBT, an MQB structure in the collector and contacting the base comprises a plurality of semiconductor layers, and the number and thicknesses of these semiconductor layers are appropriately selected so that the height of the effective potential barrier of the MQB increases in steps from the base into the collector and the width of each step, i.e., the interval of the same height, of the effective potential barrier is shorter than the traveling distance of an electron during the intervalley scattering relaxation time of the electron. Therefore, intervalley scattering of electrons is effectively suppressed and a reduction in the electron mobility due to intervalley scattering is suppressed, reducing the collector transit time.

According to a fifth aspect of the present invention, an HBT includes an intrinsic type (i type) MQB in the collector as a part of the collector. The i type MQB has an energy band structure in which the height of the effective potential barrier increases in steps from the base into the collector. Therefore, the electric field in a region of the collector in the vicinity of the base-collector interface is relaxed, whereby a reduction in electron mobility due to intervalley scattering of electrons is suppressed, reducing the collector transit time. In addition, since the MQB is of intrinsic conductivity the Kirk effect is reduced whereby a high maximum cut-off frequency $f_T$ is achieved.

DETAILED DESCRIPTION OF THE PREFERRED EMBODIMENTS

Figure 1:
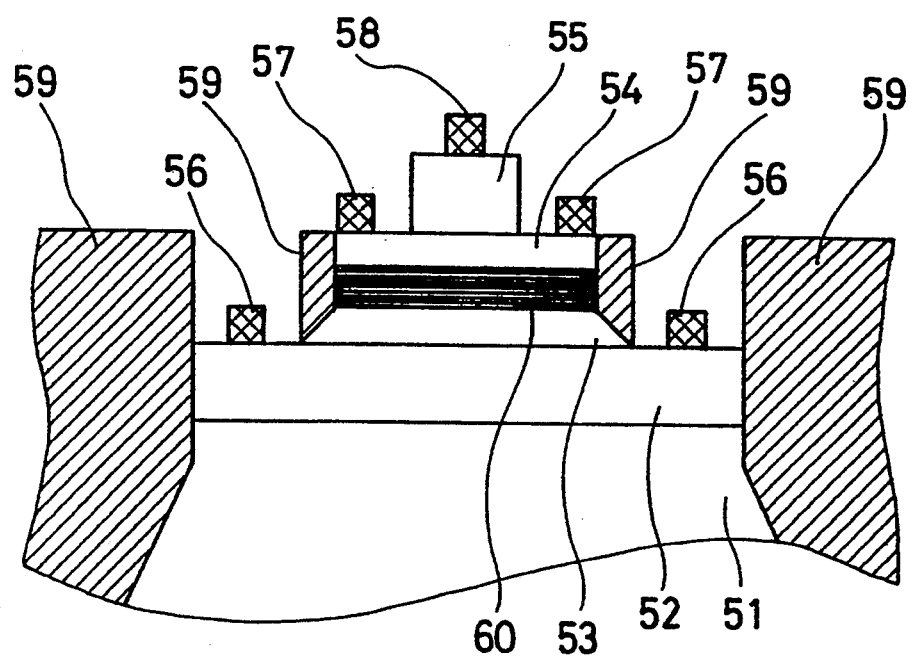
FIG. 1 is a sectional view illustrating an HBT in accordance with a first embodiment of the present invention.
Figure 6:
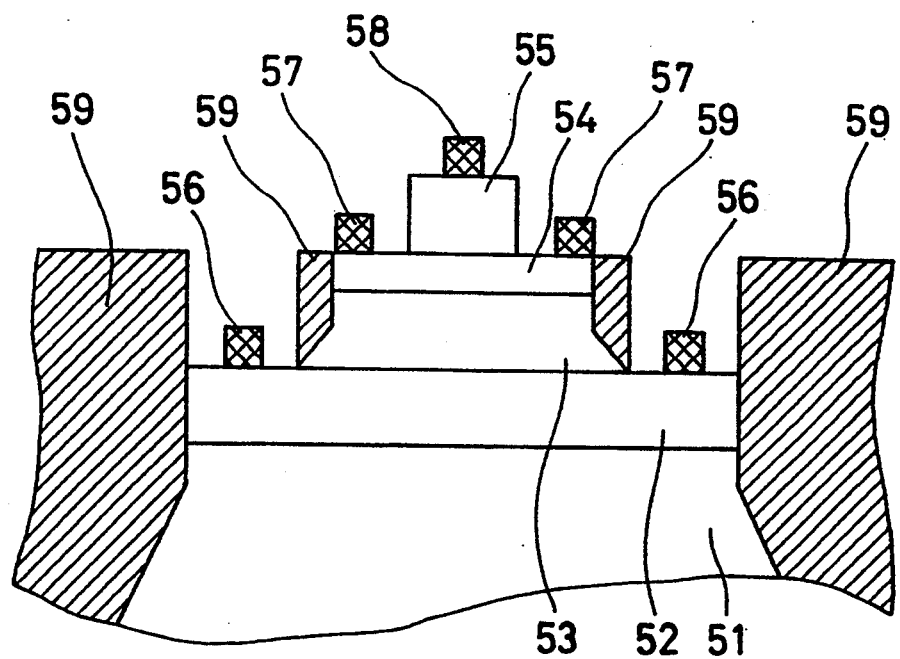
FIG. 6 is a sectional view illustrating a conventional HBT.
Figure 7:
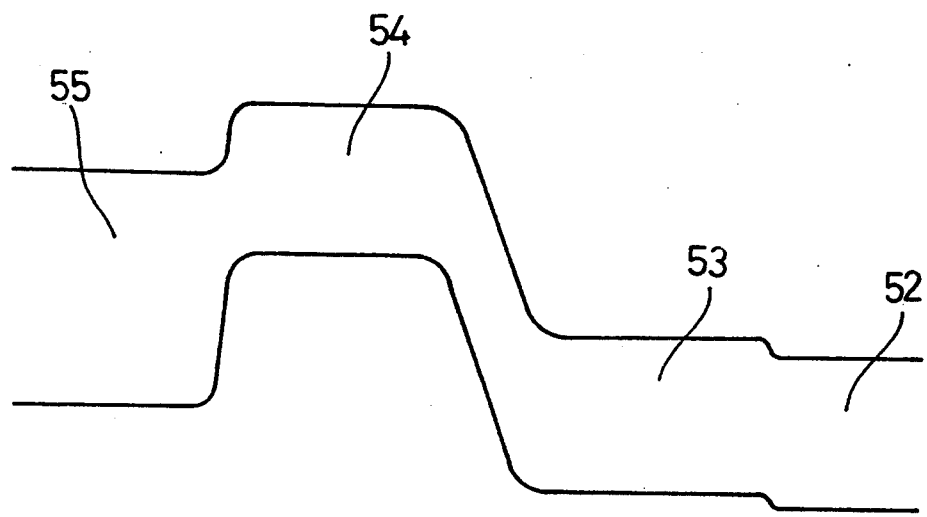
FIG. 7 is an energy band diagram of the HBT of FIG. 6 during operation.

FIG. 1 is a sectional view illustrating an n-p-n type AlGaAs/GaAs HBT in accordance with a first embodiment of the present invention. In the figure, the same reference numerals as in FIG. 6 designate the same or corresponding parts. This HBT includes a p type MQB structure 60 between the p type GaAs base layer 54 and the n type GaAs collector layer 53. The p type MQB structure 60 comprises alternating $Al_xGa_{1-x}As$ layers and GaAs layers. By appropriately selecting the number and thicknesses of the $Al_xGa_{1-x}As$ layers and the GaAs layers included in the MQB 60, the height of an effective potential barrier due to the quantum effect of the MQB 60 is increased in steps from the base layer 54 to the collector layer 53 so that the width of each step, i.e., each interval of the same energy, of the effective potential barrier is shorter than the traveling distance of an electron in the collector during the intervalley scattering relaxation time of the electron.

Figure 2:
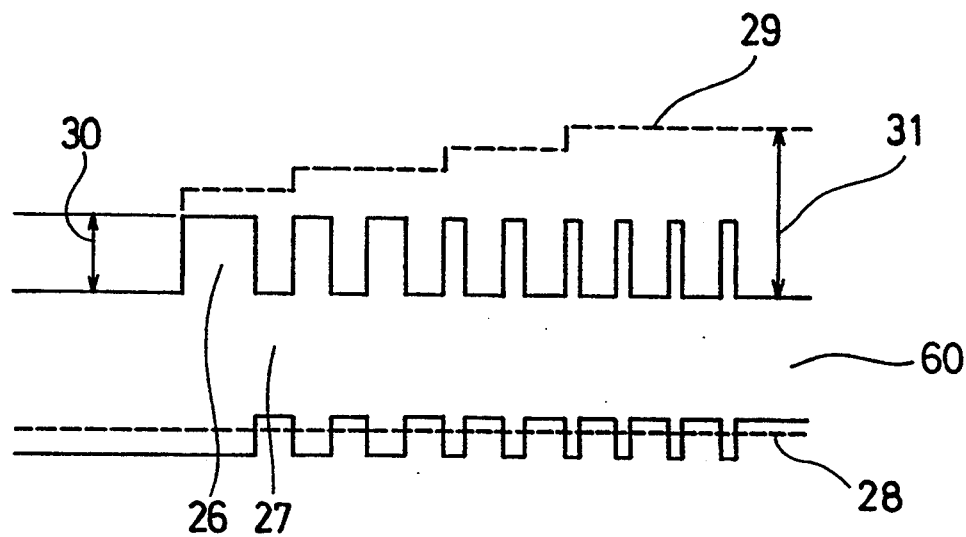
FIG. 2 is an energy band diagram of a p type MQB structure employed in the first embodiment of the present invention.

FIG. 2 is an energy band diagram of the p type MQB structure 60. In the figure, the p type MQB 60 comprises a plurality of p type $Al_xGa_{1-x}As$ layers 26 and a plurality of p type GaAs layers 27 which are alternatingly laminated. Reference numeral 28 designates the Fermi level in the p type MQB 60. Reference numeral 29 designates an effective potential barrier to electrons due to the quantum effect of the p type MQB 60 (hereinafter referred to simply as the effective potential barrier). Reference numeral 30 designates the height of a classical potential barrier of the p type $Al_xGa_{1-x}As$ layer 26 to electrons. Reference numeral 30 designates the total height of the effective potential barrier of the p type MQB structure 60.

Figure 3:
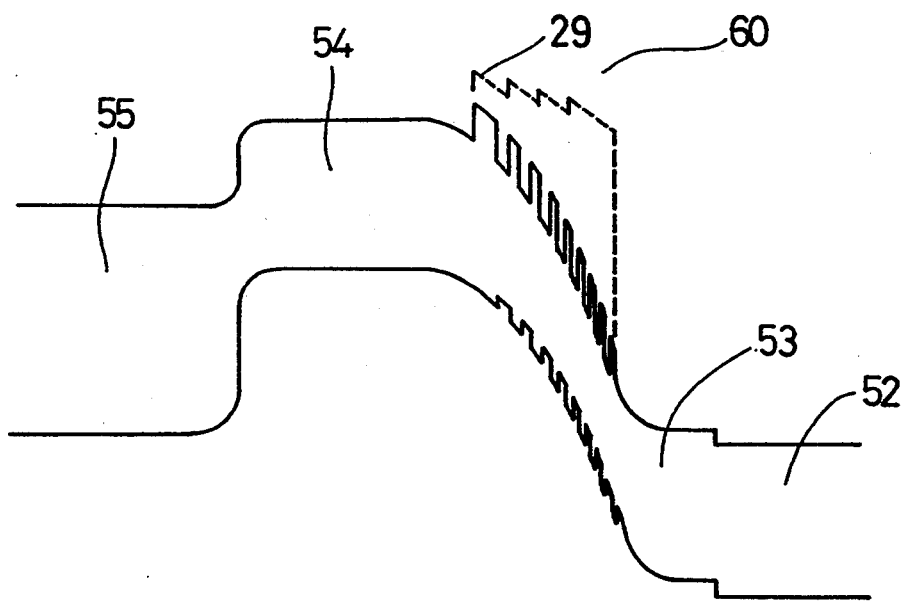
FIG. 3 is an energy band diagram of the HBT according to the first embodiment during operation.

FIG. 3 is an energy band diagram of the HBT of FIG. 1 during operation. In the figure, the same reference numerals as in FIGS. 1 and 2 designate the same or corresponding parts.

A description is given of the operation. As shown in FIG. 2, when a plurality of thin $Al_xGa_{1-x}As$ layers 26 and a plurality of thin GaAs layers 27 are alternatingly laminated to form a multiquantum well (hereinafter referred to as MQW) structure, the height of the effective potential barrier 29 exceeds the height of the classical potential barrier 30 which is equivalent to the conduction band energy gap of the $Al_xGa_{1-x}As$ barrier layers. In addition, the height of the effective potential barrier 29 increases with decrease in the thicknesses of the semiconductor layers included in the MQW structure even if the Al composition ratios x of the $Al_xGa_{1-x}As$ layers of the barrier layer are uniform.

In this first embodiment of the present invention, as shown in FIG. 2, the Al composition ratios (x) of the p type $Al_xGa_{1-x}As$ layers 26 included in the MQB structure are fixed at 0.3 and the thicknesses of the $Al_xGa_{1-x}As$ layers 26 are gradually reduced from the base to the collector, whereby the height of the effective potential barrier 29 increases in steps from the base to the collector. Assuming that a pair of the p type GaAs layer 27 and the p type $Al_xGa_{1-x}As$ layer 26 are one period and the MQW structure includes nine periods, the p type GaAs layers 27 are all the same thickness of 56.5 Å and the p type $Al_xGa_{1-x}As$ layers 26 are of different thicknesses which vary as follows. The thickness of the p type $Al_xGa_{1-x}As$ layer 26 is 186.8 Å in the first period, 28.3 Å in the second and third periods, 22.6 Å in the fourth and fifth periods, and 17.0 Å in the sixth, seventh, eighth, and ninth periods. The height of the effective potential barrier 29 increases in steps as shown in FIG. 2 and, finally, the total height 31 of the effective potential barrier 29 is about 0.3 eV higher than the height of the classical potential barrier 30. In the HBT of this first embodiment including the MQB 60 between the collector layer 53 and the base layer 54, as shown in FIG. 3, the gradient of the effective potential barrier 29 is gentler than the gradient of the conduction band that is classically determined, even in the state where the bias voltage $V_{BC}$ is applied across the base and the collector. This means that the strong electric field in a region of the collector in the vicinity of the base-collector interface is relaxed. Therefore, in this first embodiment of the present invention, the intervalley scattering of electrons due to the strong electric field at the base-collector interface is suppressed, whereby a reduction in the electron mobility and an increase in the collector transit time are suppressed.

Furthermore, in this first embodiment of the present invention, it is assumed that the spatial traveling distance of an electron during the relaxation time of the intervalley scattering of the electron (time interval during which an electron traveling in the collector receives high energy from the electric field and is subjected to intervalley scattering) is about 250 Å, and the number and thicknesses of the $Al_xGa_{1-x}As$ layers 26 and the GaAs layers 27 included in the MQB structure 60 are appropriately selected so that the height of the effective potential barrier 29 of the MQB structure 60 increases in steps and the width of each step, i.e., each interval of the same height, of the effective potential barrier 29 is shorter than the spatial traveling distance of the electron, i.e., about 250 Å, whereby the intervalley scattering is effectively suppressed.

When the spatial traveling distance of an electron during the relaxation time of the intervalley scattering is about 250 Å, the electron is accelerated due to the electric field along a distance of 250 Å and an overshoot occurs, so that the electron travels at high speed. However, if an interval of the same height as the effective potential barrier 29 exceeds 250 Å, the electron is subjected to intervalley scattering and reduced transit speed. In this first embodiment, the height of the effective potential barrier 29 is increased in steps so that the width of each step, i.e., each interval of the same height, of the effective potential barrier is shorter than the spatial traveling distance of an electron during the relaxation time of the intervalley scattering, whereby the height of the effective potential barrier is increased just before the intervalley scattering of the electron to make the electron lose kinetic energy, thereby effectively suppressing the intervalley scattering.

The HBT shown in FIG. 1 is fabricated according to the process steps described hereinafter.

Initially, there are successively grown on the semi-insulating GaAs substrate 51 the n+ type GaAs collector contact layer 52, the n type GaAs collector layer 53, the p type $Al_xGa_{1-x}As$ /GaAs MQB structure 60, the p+ type GaAs base layer 54, and the n type $Al_{0.3}Ga_{0.7}As$ emitter layer 55. These layers are epitaxially grown by MOCVD.

Thereafter, the insulating regions 59 are formed by ion implantation, and the epitaxially grown layers 53, 60, 54, and 55 are patterned in desired shapes using an etching technique. To complete the HBT of FIG. 1, the collector, base, and emitter electrodes 56, 57, and 58 are formed using a self-aligning technique or the like.

In the present MOCVD method, it is possible to epitaxially grow the respective layers while controlling the thicknesses of these layers in angstroms and, therefore, an MQB structure in which the thickness of each layer is precisely set is easily fabricated. In addition, since the Al composition ratios x of the $Al_xGa_{1-x}As$ layers of the MQB structure are uniform, all of the $Al_xGa_{1-x}As$ layers can be grown employing the same source gas supply ratio, so that the MOCVD process is easily controlled.

According to the first embodiment of the present invention, in the GaAs HBT, the p type MQB comprising a plurality of semiconductor layers whose thicknesses are gradually reduced from the base to the collector is interposed between the base and the collector, whereby the height of the effective potential barrier of the MQB is increased in steps from the base to the collector so that the width of each step, i.e., each interval of the same height, of the effective potential barrier is shorter than the traveling distance of an electron in the collector during the intervalley scattering relaxation time. Therefore, intervalley scattering of the electron traveling in the collector is suppressed, whereby an electron maintains a high mobility and the collector transit time of the electron is reduced. In addition, since the MQB is fabricated using MOCVD and the Al composition ratios of the $Al_xGa_{1-x}As$ layers are uniform, the production process is simplified.

While in the above-described first embodiment the height of the effective potential barrier of the MQB is increased in steps from the base to the collector so that the width of each step, i.e., each interval of the same height, of the effective potential barrier is shorter than the traveling distance of an electron in the collector during the intervalley scattering relaxation time, the interval of the same height of the effective potential barrier may be longer than the traveling distance of the electron. Even in this case, the gradient of the effective potential barrier due to the quantum effect of the MQB is gentler than the gradient of the conduction band that is classically determined even if a bias voltage is applied across the base and the collector, whereby the electric field in a region of the collector in the vicinity of the base-collector interface is relaxed and the intervalley scattering that reduces the electron mobility is suppressed. Therefore, an increase in the collector transit time due to the reduction in the electron mobility is suppressed.

A description is given of a second embodiment of the present invention. An n-p-n type AlGaAs/GaAs HBT according to this second embodiment includes an intrinsic type (hereinafter referred to as i type) MQB comprising alternating i type $Al_xGa_{1-x}As$ layers and i type GaAs layers between a p+ type GaAs base layer and an n type GaAs collector layer. That is, the p type MQB of the HBT according to the first embodiment is replaced with the i type MQB.

Figure 4:
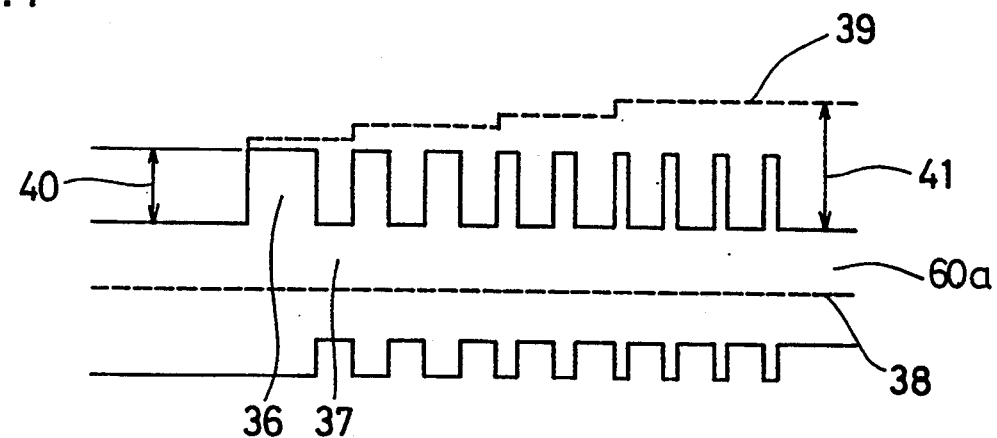
FIG. 4 is an energy band diagram of an intrinsic conductivity type MQB structure in accordance with a second embodiment of the present invention.

FIG. 4 is an energy band diagram of the i type MQB structure interposed between the base layer and the collector layer. In the figure, the i type MQB 60a comprises a plurality of i type $Al_xGa_{1-x}As$ layers 36 and a plurality of i type GaAs layers 37 which are alternatingly laminated. Reference numeral 38 designates the Fermi level. Reference numeral 39 designates an effective potential barrier to electrons due to the quantum effect of the i type MQB 60a (hereinafter referred to simply as effective potential barrier). Reference numeral 40 designates the height of a classical potential barrier of the i type $Al_xGa_{1-x}As$ layer 36 to electrons. Reference numeral 41 designates the total height of the effective potential barrier of the i type MQB 60a to electrons. Also in this second embodiment, as in the above-described first embodiment, by appropriately selecting the number and thicknesses of the $Al_xGa_{1-x}As$ layers 36 and the GaAs layers 37, the height of the quantum effective potential barrier 39 of the MQB 60a is increased in steps from the base layer to the collector layer so that the width of each step, i.e., each interval of the same height, of the effective potential barrier 39 is shorter than the traveling distance of an electron in the collector during the intervalley scattering relaxation time.

A description is given of the operation. Also in this second embodiment, since the MQB 60a having an energy band structure in which the height of the effective potential barrier is increased in steps from the base layer to the collector layer is interposed between the base layer and the collector layer, the electric field in a region of the collector in the vicinity of the base-collector interface is relaxed and the collector transit time is reduced. In addition, since the number and the thicknesses of the $Al_xGa_{1-x}As$ layers 36 and the GaAs layers 37 are appropriately selected so that each interval of the same height of the effective potential barrier is shorter than the traveling distance of an electrons in the collector during the intervalley scattering relaxation time, the intervalley scattering of the electrons is effectively suppressed, whereby the electron maintains high mobility and the collector transit time of the electron is reduced.

When the p type layer, i.e., the p type MQB 60, is included in the collector region as in the first embodiment of the present invention, negative space charges are produced in the collector region. With an increase in the collector current, the negative space charge increases because electrons injected into the collector from the base are added and, at last, the quantity of negative charges becomes equivalent to that in the base layer, which means that the base layer equivalently extends in the collector layer. This phenomenon is called the "Kirk effect". The Kirk effect increases the base transit time of electrons, whereby the maximum cut-off frequency $f_T$ is reduced.

In the second embodiment of the present invention, however, the MQB structure included in the collector region is not p type but i type. In this case, as shown in FIG. 4, the Fermi level 38 is positioned in the center of the energy band, and the effective potential barrier 39 is lower than that of the first embodiment employing the p type MQB. Accordingly, the total height 41 of the effective potential barrier is also lowered. However, since ideally no space charge is present in the i type MQB 60a, the above-described Kirk effect hardly occurs, and the maximum cut-off frequency $f_T$ can be increased at high collector current density.

According to the second embodiment of the present invention, in the GaAs HBT, the i type MQB 60a is interposed between the base layer and the collector layer, and the i type MQB has an energy band structure in which the height of the effective potential barrier 39 increases in steps from the base layer to the collector layer so that the width of each step, i.e., each interval of the same height, of the effective potential barrier is shorter than the traveling distance of an electron in the collector during the intervalley scattering relaxation time. Therefore, the intervalley scattering of an electron traveling in the collector is suppressed, whereby the electron maintains high mobility and the collector transit time of the electron is reduced. In addition, since the Kirk effect is avoided, the maximum cut-off frequency $f_T$ can be increased at high collector current density, resulting in a high maximum cut-off frequency $f_T$.

While in the above-described second embodiment the height of the effective potential barrier 39 of the MQB 60a is increased in steps from the base to the collector so that the interval of the same height of the effective potential barrier 39 is shorter than the traveling distance of an electron in the collector during the intervalley scattering relaxation time, the interval of the same height of the effective potential barrier 39 may be longer than the traveling distance of the electron. Even in this case, an increase in the collector transit time of the electron due to the reduction in the electron mobility can be suppressed.

A description is given of a third embodiment of the present invention.

In the above-described first and second embodiments, the height of the effective potential barrier of the MQB is increased in steps from the base to the collector by gradually decreasing the thicknesses of the $Al_xGa_{1-x}As$ layers included in the MQB from the base to the collector while maintaining a uniform Al composition ratio x. On the other hand, in this third embodiment of the present invention, the Al composition ratios x of the respective $Al_xGa_{1-x}As$ layers are Gradually increased from the base to the collector to increase the height of the classical potential barrier, whereby the height of the effective potential barrier of the MQB is increased from the base to the collector.

Figure 5:
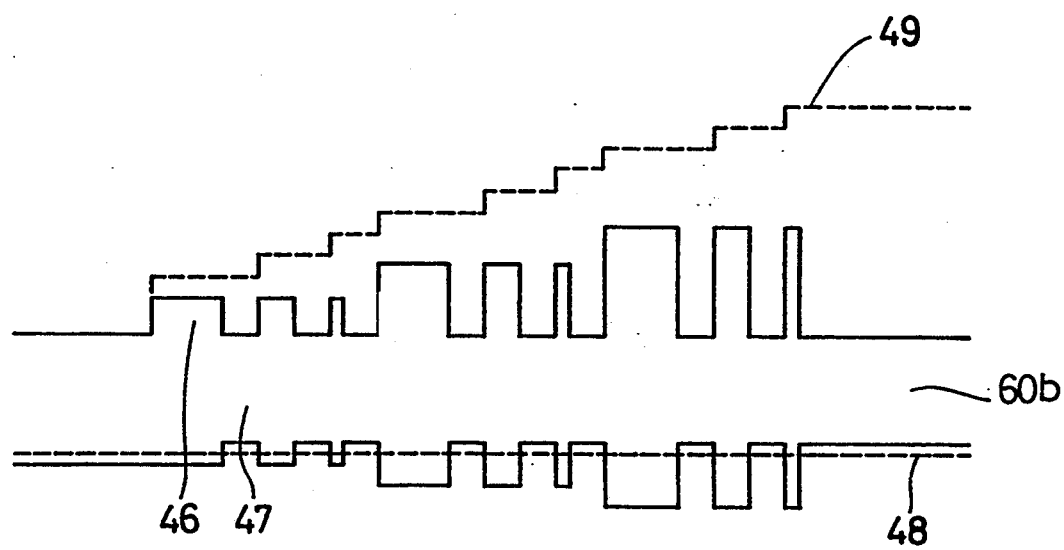
FIG. 5 is an energy band diagram of a p type MQB structure in accordance with a third embodiment of the present invention.

FIG. 5 is an energy band diagram of a p type MQB structure interposed between the base layer and the collector layer according to the third embodiment of the present invention. In the figure, the p type MQB 60b comprises a plurality of p type $Al_xGa_{1-x}As$ layers 46 and a plurality of p type GaAs layers 47 which are alternatingly laminated. In addition, reference numeral 48 designates the Fermi level and numeral 49 designates the effective potential barrier to electrons due to the quantum effect of the p type MQB 60b (hereinafter referred to simply as effective potential barrier).

In this third embodiment, assuming that a pair including the $Al_xGa_{1-x}As$ layer 46 and the GaAs layer 47 are one period, the Al composition ratios x of the $Al_xGa_{1-x}As$ layers 46 are increased every three periods from the base to the collector, whereby the height of the classical potential barrier is increased to increase the height of the effective potential barrier 49 of the MQB 60b.

In FIG. 5, for example, the Al composition ratio x of the $Al_xGa_{1-x}As$ layers 46 in the first, second, and third periods is 0.1, that in the fourth, fifth, and sixth periods is 0.3, and that in the seventh, eighth, and ninth periods is 0.5, whereby the height of the effective potential barrier 49 of the MQB 60b is increased in steps from the base to the collector. In addition, the thicknesses of the three $Al_xGa_{1-x}As$ layers 46 having the same Al composition ratio x are gradually decreased from the base to the collector, whereby the height of the effective potential barrier 49 is varied at short intervals.

A description is given of the operation. In this third embodiment, since the Al composition ratios x of the $Al_xGa_{1-x}As$ layers 46 are increased at prescribed periods from the base to the collector to increase the height of the classical potential barrier and the thicknesses of these layers are varied, the height of the effective potential barrier 49 of the MQB 60b is increased from the base to the collector. Therefore, the variation in the effective potential barrier 49 between the base and the collector in a state where the bias voltage $V_{BC}$ is applied across the base and the collector is gentler than that of the first embodiment. Therefore, relaxation of the electric field between the base and the collector is promoted and the intervalley scattering of electrons is suppressed, whereby the electrons maintain a high mobility and the collector transit time of the electron is further reduced.

In the above-described first embodiment, since the Al composition ratios x of the $Al_xGa_{1-x}As$ layers of the p type MQB 60 are fixed at 0.3, the first potential barrier to electrons injected into the collector from the base is the effective potential barrier of the $Al_{0.3}Ga_{0.7}As$ layer in the first period. In this case, since this first potential barrier is too high for electrons having low energies to cross, the electron injection efficiency is reduced, resulting in a reduction in the current gain $\beta$. In this third embodiment, however, since the Al composition ratio x of the $Al_xGa_{1-x}As$ layer in the first period is 0.1, the first potential barrier to electrons is the effective potential barrier of the $Al_{0.1}Ga_{0.9}As$ layer in the first period, i.e., the first potential barrier is lowered compared to that of the first embodiment. Therefore, even electrons having low energies can cross the first potential barrier, so that reductions in the electron injection efficiency and the current gain $\beta$ are avoided.

According to the third embodiment of the present invention, in the GaAs HBT, the MQB 60b comprising alternating $Al_xGa_{1-x}As$ layers 46 and GaAs layers 47 is interposed between the base and the collector and the Al composition ratios x of the $Al_xGa_{1-x}As$ layers 46 are gradually increased from the base to the collector the thicknesses of these layers 46 are gradually reduced from the base to the collector, whereby the height of the effective potential barrier 49 of the MQB 60b is increased in steps from the base to the collector. Therefore, the electric field in a region of the collector in the vicinity of the base-collector interface is relaxed, whereby a reduction in the electron mobility due to the intervalley scattering of electrons is suppressed and the collector transit time of the electrons is reduced. In addition, since the Al composition ratio x of the $Al_xGa_{1-x}As$ layer 46 in contact with the base layer is lowered to reduce the energy band gap of that layer, the electron injection efficiency from the base to the collector is increased.

While in the above-described third embodiment both the Al composition ratios and the thicknesses of the $Al_xGa_{1-x}As$ layers 47 are varied, the $Al_xGa_{1-x}As$ layers 47 may be of uniform thickness.

Although the thicknesses of the $Al_xGa_{1-x}As$ layers 47 and the GaAs layers 46 included in the MQB 60b are not specified in the above-described third embodiment, the thicknesses and the number of the respective layers should be arbitrarily selected so that the interval between the same height of the effective potential barrier 49 is shorter than the traveling distance of an electron in the collector during the intervalley scattering relaxation time of the electron. Then, the intervalley scattering is effectively suppressed and the electron maintains high mobility, whereby the collector transit time of the electron is reduced.

While in the above-described third embodiment the MQB 60b is p type, the MQB may be i type. In this case, similarly as in the above-described second embodiment, the Kirk effect is suppressed and the collector current density is increased, whereby the maximum cut-off frequency $f_T$ is increased.

Meanwhile, IEEE Transactions on Electron Devices, Vol. 35, No. 4, April 1988 discloses an AlGaAs/GaAs HBT with a modified collector structure in which the collector layer is a three-layer structure comprising an i type layer, a p+ type layer, and an n+ type layer with the i type layer in contact with a p+ type base layer. In this HBT, the i type layer having high electron mobility occupies a greater part of a collector depletion layer, whereby the collector transit velocity of the electron is increased. Although in this publication the i type layer is a single GaAs layer about 2000 Å thick, if the i type GaAs layer is replaced with an i type MQB of an energy band structure in which the height of the effective potential barrier increases from the p+0 type base layer to the p+ type layer, the electric field in this region is relaxed, whereby the intervalley scattering is suppressed and the collector transit velocity is further increased. The height of the effective potential barrier of this i type MQB is increased from the p+ type base to the p+ type layer by gradually decreasing the thicknesses of the semiconductor layers included in the MQB from the base to the p+ type layer or by gradually increasing the energy band gaps of the semiconductor layers included in the MQB from the base to the p+ type layer. Alternatively, variations in both the thicknesses and the energy band gaps may be employed.

While in the above-described first to fourth embodiments GaAs HBTs comprising GaAs and AlGaAs are described, the present invention may be applied to an InP HBT using an InP substrate, with the same effects as described above. In this case, the MQB structure comprises alternating InP layers and InGaAs layers or alternating InAlAs layers and InGaAs layers.

Furthermore, the present invention may be applied to HBTs other than the GaAs HBT and InP HBT, for example, an Si (silicon) HBT, with the same effects as described above. In the Si HBT, the MQB comprises alternating Si layers and SiGe (silicon germanium) layers.

What is claimed is:

1. A heterojunction bipolar transistor including an emitter, a base, and a collector, said collector including a multiquantum barrier structure contacting said base, said multiquantum barrier structure having an energy band structure including an effective potential barrier increasing in steps from said base into said collector.

2. The heterojunction bipolar transistor of claim 1 wherein said multiquantum barrier structure comprises a plurality of well layers comprising a first semiconductor having a first energy band gap and a plurality of barrier layers having thicknesses and comprising a second semiconductor having a second energy band gap larger than the first energy band gap, said well layers and barrier layers being alternatingly laminated, wherein the thicknesses of said barrier layers gradually decrease from said base into said collector.

3. The heterojunction bipolar transistor of claim 1 wherein said multiquantum barrier structure comprises a plurality of well layers comprising a first semiconductor having a first energy band gap and a plurality of barrier layers comprising a second semiconductor having a second energy band gap larger than the first energy band gap, said well layers and barrier layers being alternatingly laminated, the energy band gap of said barrier layers gradually increasing from said base into said collector.

4. The heterojunction bipolar transistor of claim 1 wherein said multiquantum barrier structure comprises a plurality of well layers comprising a first semiconductor having a first energy band gap and a plurality of barrier layers having thicknesses and comprising a second semiconductor having a second energy band gap larger than the first energy band gap, said well layers and barrier layers being alternatingly laminated, wherein the thicknesses and number of said well layers and barrier layers are selected so that the steps of the effective potential barrier are narrower than a distance travelled by an electron in said collector during an electron intervalley scattering relaxation time.

5. The heterojunction bipolar transistor of claim 1 wherein said multiquantum barrier structure and said base have the same conductivity type.

6. The heterojunction bipolar transistor of claim 1 wherein said multiquantum barrier structure is of intrinsic conductivity type.

7. The heterojunction bipolar transistor of claim 1 wherein said multiquantum barrier structure contacts said base and said collector includes a p+ type layer and an n type layer.

8. The heterojunction bipolar transistor of claim 1 wherein said heterojunction bipolar transistor is a GaAs heterojunction bipolar transistor and said multiquantum barrier structure comprises alternating layer of GaAs and AlGaAs.

9. The heterojunction bipolar transistor of claim 1 wherein said heterojunction bipolar transistor is an InP heterojunction bipolar transistor and said multiquantum barrier structure comprises alternating layers of InGaAs and one of InAlAs and InP.

10. The heterojunction bipolar transistor of claim 1 wherein said heterojunction bipolar transistor is a silicon heterojunction bipolar transistor and said multiquantum barrier structure comprises alternating layers of silicon and silicon germanium alloy.

* * * * *